(12) United States Patent
Guo et al.

(10) Patent No.: US 12,628,438 B2
(45) Date of Patent: May 12, 2026

(54) WELDING RIBBON COMPONENT AND PREPARATION METHOD THEREFOR, AND PHOTOVOLTAIC MODULE

(71) Applicant: ANHUI HUASUN ENERGY CO., LTD., Xuancheng (CN)

(72) Inventors: Qi Guo, Xuancheng (CN); Ruizhi Luo, Xuancheng (CN); Daoren Gong, Xuancheng (CN)

(73) Assignee: ANHUI HUASUN ENERGY CO., LTD., Xuancheng (CN)

( * ) Notice: Subject to any disclaimer, the term of this patent is extended or adjusted under 35 U.S.C. 154(b) by 93 days.

(21) Appl. No.: 18/577,659

(22) PCT Filed: Mar. 29, 2023

(86) PCT No.: PCT/CN2023/084853
§ 371 (c)(1),
(2) Date: Jan. 8, 2024

(87) PCT Pub. No.: WO2024/087506
PCT Pub. Date: May 2, 2024

(65) Prior Publication Data
US 2025/0255012 A1      Aug. 7, 2025

(30) Foreign Application Priority Data
Oct. 27, 2022    (CN) .......................... 202211339959.9

(51) Int. Cl.
H10F 19/90        (2025.01)
H02S 40/38        (2014.01)
H10F 71/00        (2025.01)
(52) U.S. Cl.
CPC ........... H10F 19/904 (2025.01); H02S 40/38 (2014.12); H10F 19/906 (2025.01); H10F 71/00 (2025.01)

(58) Field of Classification Search
CPC ...................................................... H10F 19/904
See application file for complete search history.

(56) References Cited

U.S. PATENT DOCUMENTS 4,367,581 A * 1/1983 Kohler ................ H10F 71/1375
29/854
2007/0095387 A1* 5/2007 Fujii ..................... H10F 19/906
136/251
(Continued)

FOREIGN PATENT DOCUMENTS

CN        203607433 U     5/2014
CN        204577445 U     8/2015
(Continued)

OTHER PUBLICATIONS

International Search Report dated May 29, 2023 for PCT Patent application No. PCT/CN2023/084853.
(Continued)

*Primary Examiner* — Sadie White
(74) *Attorney, Agent, or Firm* — Maschoff Brennan

(57) ABSTRACT

The present application provides a welding ribbon component and a preparation method therefor, and a photovoltaic module. The welding ribbon component includes: a first welding ribbon segment, a second welding ribbon segment, and a connecting segment, and the connecting segment is located between the first welding ribbon segment and the second welding ribbon segment. The first welding ribbon segment includes a first welding ribbon body, a surface of the first welding ribbon body being provided with a depression; and a first welding coating located at least on a surface of an inner wall of the depression. The welding ribbon component of the present application can increase the thickness of the welding coating to improve the welding tension, (Continued)

and can reasonably control the thickness to prevent cracking, while also achieving high-density packaging.

10 Claims, 4 Drawing Sheets

(56) References Cited

U.S. PATENT DOCUMENTS

| | | | | |
|---|---|---|---|---|
| 2011/0240339 A1* | 10/2011 | Wang | H10F 19/904 | |
| | | | 174/126.2 | |
| 2012/0103385 A1* | 5/2012 | Hong | H10F 77/70 | |
| | | | 257/E31.124 | |
| 2014/0124027 A1* | 5/2014 | Teshima | H10F 71/121 | |
| | | | 438/98 | |
| 2020/0035847 A1* | 1/2020 | Terashita | H10F 19/85 | |
| 2022/0216357 A1 | 7/2022 | Pujari et al. | | |

FOREIGN PATENT DOCUMENTS

| CN | 108428760 A | 8/2018 |
|---|---|---|
| CN | 108682711 A | 10/2018 |
| CN | 108767046 A | 11/2018 |
| CN | 208970536 U | 6/2019 |
| CN | 210073887 U | 2/2020 |
| CN | 211150574 U | 7/2020 |
| CN | 212323017 U | 1/2021 |
| CN | 213459762 U | 6/2021 |
| CN | 113451433 A | 9/2021 |
| CN | 214753807 U | 11/2021 |
| CN | 115602745 A | 1/2023 |
| JP | 2006270043 A | 10/2006 |
| JP | 2007273857 A | 10/2007 |
| JP | 2010016320 A | 1/2010 |
| JP | 2005191201 A | 12/2010 |
| JP | 2010283138 A | 12/2010 |
| JP | 2015029991 A | 2/2015 |
| JP | 2016006913 A | 1/2016 |
| JP | 2017120906 A | 7/2017 |
| JP | 2019510361 A | 4/2019 |
| JP | 3237133 U | 4/2022 |
| JP | 2022533718 A | 7/2022 |
| WO | 2014173331 A1 | 10/2014 |
| WO | 2017009957 A1 | 1/2017 |
| WO | 2021/093867 A1 | 5/2021 |

OTHER PUBLICATIONS

Written Opinion of the International Searching Authority dated May 6, 2023 for PCT Patent application No. PCT/CN2023/084853.

First Office Action dated Mar. 10, 2024 for Chinese Patent application No. 202211339959.9.

Second Office Action dated May 24, 2024 for Chinese Patent application No. 202211339959.9.

Third Office Action dated Aug. 11, 2024 for Chinese Patent application No. 202211339959.9.

Notice of Rejection dated Jan. 4, 2025 for Chinese Patent application No. 202211339959.9.

Search Report dated Oct. 23, 2024 for European Patent application No. 23828318.8.

First Office Action dated Apr. 1, 2025 for JP Patent application No. 2024-510527.

* cited by examiner

WELDING RIBBON COMPONENT AND PREPARATION METHOD THEREFOR, AND PHOTOVOLTAIC MODULE

CROSS-REFERENCE TO RELATED APPLICATION

The present application claims priority to Chinese Patent Application No. 202211339959.9, entitled "WELDING RIBBON COMPONENT AND PREPARATION METHOD THEREFOR, AND PHOTOVOLTAIC MODULE", filed to the China Patent Office on Oct. 27, 2022, the entire content of which is incorporated herein by reference.

TECHNICAL FIELD

The present application relates to the field of solar cells, to a welding ribbon component and a preparation method therefor, and a photovoltaic module.

BACKGROUND

Solar cells are apparatuses that directly or indirectly convert solar radiation energy into electrical energy through photoelectric or photochemical effects by absorbing sunlight. After the preparation of solar battery pieces, it is necessary to use welding ribbon components to weld the solar battery pieces together to form a cell string, and then form the cell string into a solar cell assembly. Heterojunction cells, as an efficient technical route that has attracted high attention in the industry in recent years, have become a recognized ultimate solution for future cell technology in the industry due to their high photoelectric conversion efficiency, excellent performance, and large cost reduction space, and they are also referred to as the leading technology for the next generation of commercial photovoltaic production in the industry. However, the heterojunction cells are limited by special properties of transparent conducting oxide (TCO) and other conductive layers, such as indium tin oxide (ITO), which is sensitive to high-temperature and requires a low-temperature welding process, and the production cost is high, which restricts the rapid development of the heterojunction cells. Due to the limitations of the low temperature in the production process of the heterojunction cells, only low-temperature tin-lead-bismuth component welding ribbons with higher prices can be adopted. At the same time, to reduce costs, enterprises are increasingly paying attention to a path of achieving "high-density packaging", that is, more battery pieces are added within a limited size range to improve power generation efficiency, hoping to share the constantly rising single watt cost with higher power generation efficiency.

A conventional welding ribbon component is a whole round wire since the contact area between the round-wire-shaped welding ribbon component and the battery pieces is too small, the conductivity is restricted, the welding tension is insufficient, and after welding, it is prone to occurring phenomena of false welding and desoldering, and the one-time forming rate of a photovoltaic module is reduced. In addition, after a welding coating on the welding ribbon component is melted, it will gather at positions of silver paste points on the battery pieces to form molten aggregates. When there are gaps between the welding ribbon component and the battery pieces, these molten aggregates will condense and form irregular foreign matter points. When the battery pieces which are connected by the welding ribbon component in series are covered by upper glass and subjected to lamination processing by using a lamination machine, such foreign matter points will greatly increase the probability of single-point stress on the battery pieces, causing hidden cracks. Therefore, a method for increasing the thickness of the welding coating is adopted currently and commonly to ensure a sufficient contact area. However, a thickness of a tin-lead-bismuth coating of the low-temperature welding ribbon is more than 5 μm higher than that of a welding ribbon coating for a conventional passivated emitter and rear cell (PERC), the increase of the thickness of the welding coating will lead to an increase in the volume of the foreign matter points, and the problem of cracking of the battery piece is exacerbated.

Therefore, it is necessary to seek a welding technical solution that can increase the thickness of the welding coating to improve the welding tension and can reasonably control the thickness to prevent cracking, while also achieving high-density packaging.

SUMMARY OF THE INVENTION

Therefore, the technical problem to be solved in the present application is to overcome the problems that the welding tension of a welding ribbon component on battery pieces is insufficient and cracking of the battery pieces is prone to in the prior art, and achieve a high-density packaging technology, to provide a welding ribbon component and a preparation method therefor, and a photovoltaic module.

The first aspect of the present application provides a welding ribbon component, including a first welding ribbon segment, a second welding ribbon segment, and a connecting segment, and the connecting segment is located between the first welding segment and the second welding ribbon segment; and the first welding ribbon segment includes: a first welding ribbon body, a surface of the first welding ribbon body being provided with a depression; and a first welding coating located at least on a surface of an inner wall of the depression.

Optionally, the first welding ribbon body has a first cross-section in a length direction perpendicular to the first welding ribbon body, an outer edge line of the first cross-section includes a first line region and a second line region connected with the first line region, the first line region is located on the surface of the inner wall of the depression. The second line region is located on the outer surface of the first welding ribbon body at two ends of the depression.

Optionally, a shape of the first line region includes a circular arc, a "V"-shape, or a trapezoid.

Optionally, the shape of the second line region includes a circular arc, a triangle, a trapezoid, or a rectangle.

Optionally, the depth of the depression is smaller than or equal to half of the maximum distance between any two points in the second line region.

Optionally, the maximum distance between any two points in the second line region is in a range from 250 μm to 350 μm.

Optionally, a distance between two intersection points of the first line region and second line region is smaller than or equal to the maximum width of the first welding ribbon body.

Optionally, the first line region is in a "V"-shape, and the base angle of the first line region is greater than 0° and smaller than 180°.

Optionally, the second welding ribbon segment includes a second welding ribbon body, a welding surface of the second welding ribbon body at least being a plane, and the welding surface and the depression being located on the upper and lower side surfaces of the welding ribbon component in a height direction respectively; and a second welding coating located at least on the welding surface of the second welding ribbon body.

Optionally, a shape of a cross-section of the second welding ribbon body in a length direction perpendicular to the second welding ribbon body includes a rectangle or a trapezoid.

Optionally, a lower surface of the second welding ribbon body in a height direction is an arc surface.

Optionally, the size of the second welding ribbon body in the height direction is smaller than the maximum size of the first welding ribbon body in the height direction.

Optionally, the size of the second welding ribbon body in the height direction is in a range from 130 μm to 200 μm.

Optionally, one end of the connecting segment is connected with one end of the first welding ribbon segment, and the other end of the connecting segment is connected with one end of the second welding ribbon segment.

Optionally, the thickness of the connecting segment gradually decreases in a direction from the first welding ribbon segment to the second welding ribbon segment.

Optionally, one side of the connecting segment facing away from the depression is an inclined plane.

Optionally, the melting point of the first welding coating is smaller than the melting point of the first welding ribbon body.

Optionally, the first welding coating includes a first tin-bismuth-lead welding coating or a first tin-bismuth-silver welding coating.

Optionally, a molar proportion of tin in the first tin-bismuth-lead welding coating is greater than or equal to 40% and smaller than 50%, a molar proportion of bismuth in the first tin-bismuth-lead welding coating is greater than or equal to 40% and smaller than 50%, and a molar proportion of lead in the first tin-bismuth-lead welding coating is greater than zero and smaller than or equal to 20%.

Optionally, a molar ratio of tin to bismuth to lead in the first tin-bismuth-lead welding coating is 4:4:2 or 43:43:14.

Optionally, a molar proportion of tin in the first tin-bismuth-silver welding coating is greater than or equal to 40% and smaller than 50%, a molar proportion of bismuth in the first tin-bismuth-silver welding coating is greater than or equal to 40% and smaller than 50%, and a molar proportion of silver in the first tin-bismuth-silver welding coating is greater than zero and smaller than or equal to 20%.

Optionally, a molar ratio of tin to bismuth to silver in the first tin-bismuth-silver welding coating is 4:4:2 or 43:43:14.

Optionally, the first welding coating has a thickness ranging from 20 μm to 30 μm.

Optionally, the melting point of the second welding coating is smaller than the melting point of the second welding ribbon body.

Optionally, the second welding coating includes a second tin-bismuth-lead welding coating or a second tin-bismuth-silver welding coating.

Optionally, a molar proportion of tin in the second tin-bismuth-lead welding coating is greater than or equal to 40% and smaller than 50%, a molar proportion of bismuth in the second tin-bismuth-lead welding coating is greater than or equal to 40% and smaller than 50%, and a molar proportion of lead in the second tin-bismuth-lead welding coating is greater than zero and smaller than or equal to 20%.

Optionally, a molar ratio of tin to bismuth to lead in the second tin-bismuth-lead welding coating is 4:4:2 or 43:43: 14.

Optionally, a molar proportion of tin in the second tin-bismuth-silver welding coating is greater than or equal to 40% and smaller than 50%, a molar proportion of bismuth in the second tin-bismuth-silver welding coating is greater than or equal to 40% and smaller than 50%. A molar proportion of silver in the second tin-bismuth-silver welding coating is greater than zero and smaller than or equal to 20%.

Optionally, a molar ratio of tin to bismuth to silver in the second tin-bismuth-silver welding coating is 4:4:2 or 43:43: 14.

Optionally, the second welding coating has a thickness ranging from 15 μm to 22 μm.

A second aspect of the present application provides a method for preparing a welding ribbon component, including: forming a first welding ribbon segment and forming a second welding ribbon segment, and a connecting segment, the connecting segment being located between the first welding ribbon segment and the second welding ribbon segment; wherein a method for forming the first welding ribbon segment includes: forming a first welding ribbon body on the first welding ribbon segment, and forming a depression on a surface of the first welding ribbon body; and forming a first welding coating at least on a surface of an inner wall of the depression.

Optionally, one end of the connecting segment relates to one end of the first welding ribbon segment, and the other end of the connecting segment is connected with one end of the second welding ribbon segment.

Optionally, a method for forming the second welding ribbon segment includes: forming a second welding ribbon body on the second welding ribbon segment, a welding surface of the second welding ribbon body at least being a plane, and the welding surface and the depression being located on upper and lower side surfaces of the welding ribbon component in a height direction respectively; and forming a second welding coating at least on the welding surface of the second welding ribbon body.

Optionally, a method for forming the second welding coating at least on the welding surface of the second welding ribbon body includes: forming a second initial welding film at least on the welding surface of the second welding ribbon body; and curing the second initial welding film to form the second welding coating.

Optionally, a process of forming the first welding ribbon body and a process of forming the second welding ribbon body and the connecting segment include a calendaring process.

Optionally, a method for forming the first welding coating at least on the surface of the inner wall of the depression includes: forming a first initial welding film on the surface of the inner wall of the depression; performing an amendment treatment on the first initial welding film to make a thickness of the first initial welding film uniform; and curing the first initial welding film after performing the amendment treatment, to form the first welding coating.

A third aspect of the present application provides a photovoltaic module, including a plurality of battery pieces; and the above welding ribbon component, the welding ribbon component being connected with the adjacent battery pieces in series; wherein for any two adjacent battery pieces, a first welding ribbon body is welded to one side of a light receiving surface of one of the battery pieces through a first welding coating.

Optionally, the welding ribbon component further includes a second welding ribbon segment and a second welding coating at least located on the welding surface of the second welding ribbon body, wherein the second welding ribbon segment includes: a second welding ribbon body, at least a welding surface of the second welding ribbon body is a plane, and the welding surface and the depression are located on upper and lower side surfaces of the welding ribbon component in a height direction respectively; wherein a melting point of the second welding coating is smaller than a melting point of the second welding ribbon body; wherein for any two adjacent battery pieces, the second welding ribbon body is welded to one side of a backlight surface of the other of the battery pieces through the second welding coating.

The technical solution of the present application has the following advantages.

1. The welding ribbon component of the present application includes the first welding ribbon segment, the first welding ribbon segment includes: the first welding ribbon body, the surface of the first welding ribbon body being provided with the depression; and the first welding coating located at least on the surface of the inner wall of the depression. According to the welding ribbon component of the present application, on the one hand, the welded first welding ribbon body can form a surface contact with the battery pieces through the depression on the surface of the first welding ribbon body, which increases the contact area between the welding ribbon component and the battery pieces, and solves the problems of poor adsorption force and prone desoldering between the welding ribbon component and the battery pieces; and on the other hand, during welding, the excess molten first welding coating can be accumulated inside the depression, which avoids the formation of sharp protrusion structures between the welding ribbon component and the battery pieces after the first welding coating is molten during welding, and avoids the formation of battery piece fragments.

2. The depression of the first welding ribbon body of the welding ribbon component of the present application may be in a plurality of shapes, such as a circular arc shape, a "V"-shape, or a trapezoid, the shape of the depression may be set according to specific application scenarios, and the universality is high.

3. The welding ribbon component of the present application further includes the second welding ribbon segment, and the second welding ribbon segment includes: the second welding ribbon body, a welding surface of the second welding ribbon body at least being a plane; and a second welding coating located at least on the welding surface of the second welding ribbon body. The welding surface of the second welding ribbon body is the plane, on the one hand, the contact area between the welding ribbon component and the battery pieces can be increased, and the problems of poor adsorption force and prone desoldering between the welding ribbon component and the battery pieces are solved; and on the other hand, even if a thin second welding coating is formed on the welding surface, it can still ensure the adsorption force between the welding ribbon component and the battery pieces, which may save materials of the second welding coating, and reduce the costs.

4. The photovoltaic module of the present application includes the above welding ribbon component, the size of the second welding ribbon body in the height direction is smaller than the maximum size of the first welding ribbon body in the height direction, the thickness of the second welding coating is relatively small, so that an overall size of the second welding ribbon segment in the height direction is relatively small, the distance between the first welding ribbon segment and the second welding ribbon segment can be reduced, a piece spacing between the battery pieces is reduced, to achieve high-density packaging while reducing the use cost of the second welding coating, and an effective area of the photovoltaic module is increased.

BRIEF DESCRIPTION OF THE DRAWINGS

To explain specific embodiments of the present application or technical solutions in the prior art more clearly, accompanying drawings used in the description of the specific embodiments or the prior art will be briefly introduced below. The accompanying drawings in the following description are some embodiments of the present application. For those ordinarily skilled in the art, other accompanying drawings may further be obtained according to these accompanying drawings without any creative labor.

DESCRIPTION OF REFERENCE NUMERALS

Figure 1:
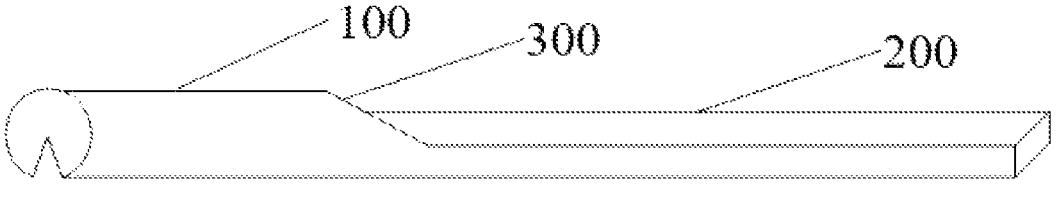
FIG. 1 is a schematic structural diagram of a welding ribbon component of an example of the present application.

100—first welding ribbon segment; 110—first welding ribbon body; 110A—first welding ribbon body; 110B—first welding ribbon body; 110C—first welding ribbon body; 110D—first welding ribbon body; 120—depression; 120A—depression; 120B—depression; 120C—depression; 120D—depression; 130—first welding coating; 130A—first welding coating; 130B—first welding coating; 130C—first welding coating; 130D—first welding coating; 200—second welding ribbon segment; 210—second welding ribbon body; 210A—second welding ribbon body; 210B—second welding ribbon body; 210C—second welding ribbon body; 210D—second welding ribbon body; 210E—second welding ribbon body; 220—second welding coating; 220A—second welding coating; 220B—second welding coating; 220C—second welding coating; 220D—second welding coating; 220E—second welding coating; 300—connecting segment; L1—maximum distance between any two points in a second line region; L2—distance between two intersection points of a first line region and the second line region; H1—depth of the depression; H2—size of the second welding ribbon body in a height direction; 400—first battery piece; and 500—second battery piece.

DETAILED DESCRIPTION

The technical solutions of the present application will be described clearly and completely in conjunction with the accompanying drawings. The described examples are part of the examples of the present application, not all of them. Based on the examples in the present application, all other examples obtained by those ordinarily skilled in the art without creative efforts shall fall within the protection scope of the present application.

In the description of the present application, it should be noted that directional or positional relationships indicated by terms such as "center", "upper", "lower", "left", "right", "vertical", "horizontal", "inner" and "outer" are based on directional or positional relationships as shown in the accompanying drawings, and are only to facilitate describing the present application and simplifying the description, rather than indicating or implying that the referred apparatus or element has to have a specific direction or be constructed and operated in the specific direction, and therefore, they cannot be regarded as limitations on the present application. In addition, the terms "first", "second" and "third" are only used to describe the purposes and cannot be understood as indicating or implying relative importance.

In the description of the present application, it should be noted that the terms "mounted", "connected" and "connection" should be understood in a broad sense unless otherwise specified and defined, for example, "connection" may be a fixed connection or a detachable connection or an integrated connection, maybe a mechanical connection or an electric connection, maybe a direct connection or an indirect connection through an intermediate medium, and may be an internal connection of two elements. For those ordinarily skilled in the art, the specific meanings of the above terms in the present application may be understood according to specific situations.

In addition, the technical features involved in the different embodiments of the present application described below may be combined as long as they do not conflict with each other.

EXAMPLE 1

Figure 2:
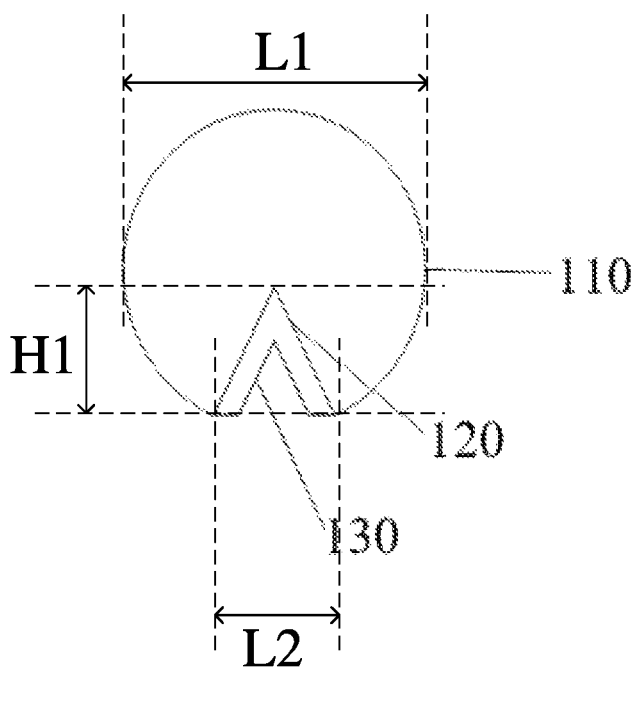
FIG. 2 to FIG. 6 are cross-sectional views of the first welding ribbon segment of an example of the present application.

Referring to FIG. 1 and FIG. 2, this example provides a welding ribbon component, including a first welding ribbon segment 100, a second welding ribbon segment 200, and a connecting segment 300, and the connecting segment 300 is located between the first welding ribbon segment 100 and the second welding ribbon segment 200. The first welding ribbon segment 100 includes: a first welding ribbon body 110, a surface of the first welding ribbon body 110 being provided with a depression 120; and a first welding coating 130 located at least on a surface of an inner wall of the depression 120.

According to the welding ribbon component of the present application, on the one hand, the welded first welding ribbon body 110 can form a surface contact with battery pieces through the depression 120 on the surface of the first welding ribbon body 110, which increases a contact area between the welding ribbon component and the battery pieces, and solves the problems of poor adsorption force and prone desoldering between the welding ribbon component and the battery pieces; and on the other hand, during welding, the excess molten first welding coating 130 can be accumulated inside the depression 120, which avoids the formation of sharp protrusion structures between the welding ribbon component and the battery pieces after the first welding coating 130 is molten during welding, and avoids the formation of battery piece fragments.

In one example, the first welding ribbon body 110 of the welding ribbon component is made of copper, and in other examples, the first welding ribbon body 110 is made of other metals, which is not specifically limited in the example of the present application.

Referring to FIG. 2, in one example, the first welding ribbon body 110 has a first cross-section in a length direction perpendicular to the first welding ribbon body 110, an outer edge line of the first cross-section includes a first line region and a second line region connected with the first line region, the first line region is located on the surface of the inner wall of the depression, and the second line region is located on an outer surface of the first welding ribbon body 110 at two ends of the depression 120.

Referring to FIG. 2, in one example, a depth H1 of the depression 120 is smaller than or equal to half of the maximum distance L1 between any two points in the second line region.

The second line region may be in different shapes, such as a circular arc shape, a triangle, a trapezoid, a rectangle, or other shapes, which is not specifically limited in the example of the present application.

A shape of a cross-section of the depression 120 in the length direction perpendicular to the first welding ribbon body 110 includes a circular arc, a "V"-shape, or a trapezoid. The shape of the cross-section of the depression 120 in the length direction perpendicular to the first welding ribbon body 110 is the shape of the first line region. The shape of the depression 120 may be set according to specific application scenarios, and the universality is high.

Figure 3:
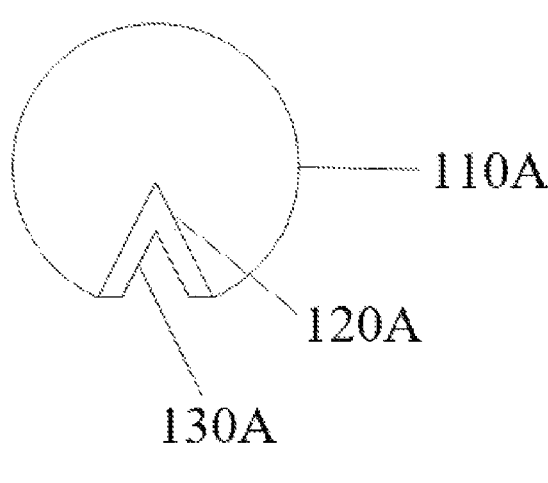

Referring to FIG. 3, in one example, the first welding ribbon segment 100 includes a first welding ribbon body 110A, a surface of the first welding ribbon body 110A being provided with a depression 120A; and a first welding coating 130A located at least on a surface of an inner wall of the depression 120A. The first line region is in a "V"-shape, and the base angle of the first line region is an acute angle.

Figure 4:
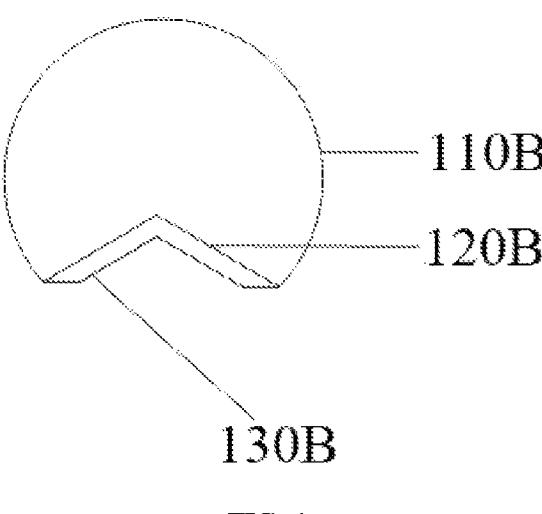

Referring to FIG. 4, in one example, the first welding ribbon segment 100 includes a first welding ribbon body 110B, a surface of the first welding ribbon body 110B being provided with a depression 120B; and a first welding coating 130B located at least on a surface of an inner wall of the depression 120B. The first line region is in a "V"-shape, and a base angle of the first line region is an obtuse angle.

Figure 5:
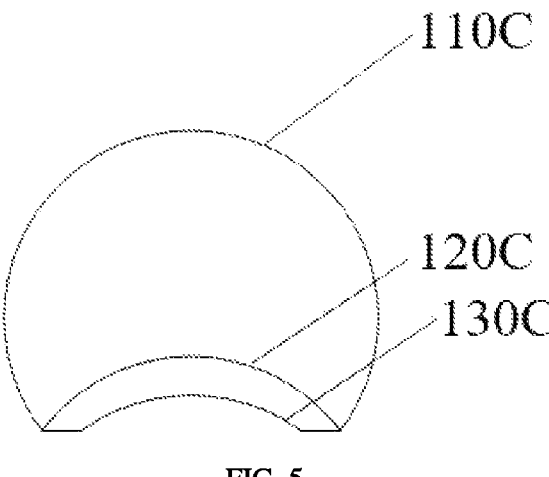

Referring to FIG. 5, in one example, the first welding ribbon segment 100 includes: a first welding ribbon body 110C, a surface of the first welding ribbon body 110C being provided with a depression 120C; and a first welding coating 130C located at least on a surface of an inner wall of the depression 120C. The first line region is in a circular arc shape.

Figure 6:
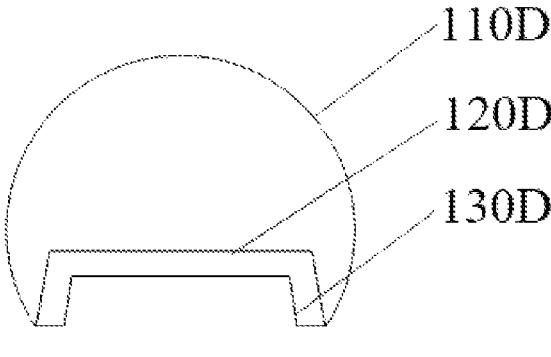

Referring to FIG. 6, in one example, the first welding ribbon segment 100 includes a first welding ribbon body 110D, a surface of the first welding ribbon body 110D being provided with a depression 120D; and a first welding coating 130D located at least on a surface of an inner wall of the depression 120D. The first line region is in a trapezoid shape.

Referring to FIG. 2, in one example, a maximum distance L1 between any two points in the second line region is in a range from 250 μm to 350 μm, for example, the maximum distance L1 between any two points in the second line region is 250 μm, 270 μm, 290 μm, 310 μm, 330 μm or 350 μm.

In one example, the second line region is in a circular arc shape, and a diameter corresponding to the second line region is in a range from 250 μm to 350 μm, such as 300 μm.

Referring to FIG. 2, in one example, a distance L2 between two intersection points of the first line region and the second line region is in a range from 200 μm to 280 μm, for example, the distance L2 between the two intersection points of the first line region and the second line region is 200 μm, 220 μm, 240 μm, 260 μm or 280 μm.

Referring to FIG. 2, in one example, a depth H1 of the depression is in a range from 50 μm to 140 μm, for example, the depth H1 of the depression is 50 μm, 60 μm, 80 μm, 100 μm, 120 μm or 140 μm.

Referring to FIG. 2, in one example, the distance L2 between two intersection points of the first line region and the second line region is smaller than or equal to the maximum width of the first welding ribbon body. In some examples, the maximum width of the first welding ribbon body is the maximum distance L1 between any two points in the second line region.

The direction of the maximum width of the first welding ribbon body 110 is parallel to a direction of the distance between two intersection points of the first line region and the second line region.

In one example, the cross-section of the depression 120 in the length direction perpendicular to the first welding ribbon body 110 is in a "V"-shape. The "V"-shape is relatively simple in processing compared with other shapes, for example, it may be formed by extrusion and other methods.

In one example, the first line region is in a "V"-shape; and the base angle of the first line region is greater than 0° and smaller than 180°. For example, the base angle of the first line region is 10°, 30°, 60°, 90°,120°, 150° or 170°.

In one example, the melting point of the first welding coating 130 is smaller than the melting point of the first welding ribbon body 110.

In one example, the first welding coating 130 includes a first tin-bismuth-lead welding coating or a first tin-bismuth-silver welding coating.

In one example, a molar proportion of tin in the first tin-bismuth-lead welding coating is greater than or equal to 40% and smaller than 50%, a molar proportion of bismuth in the first tin-bismuth-lead welding coating is greater than or equal to 40% and smaller than 50%, and a molar proportion of lead in the first tin-bismuth-lead welding coating is greater than zero and smaller than or equal to 20%. For example, the molar ratio of tin to bismuth to lead in the first tin-bismuth-lead welding coating is 4:4:2 or 43:43:14.

In one example, a molar proportion of tin in the first tin-bismuth-silver welding coating is greater than or equal to 40% and smaller than 50%; a molar proportion of bismuth in the first tin-bismuth-silver welding coating is greater than or equal to 40% and smaller than 50%, and a molar proportion of silver in the first tin-bismuth-silver welding coating is greater than zero and smaller than or equal to 20%. For example, the molar ratio of tin to bismuth to silver in the first tin-bismuth-silver welding coating is 4:4:2 or 43:43:14.

In the above example, the first tin-bismuth-lead welding coating or the first tin-bismuth-silver welding coating selected by the first welding coating 130 may both achieve low-temperature welding. A transparent conducting layer in the battery pieces is sensitive to high temperatures, and the use of the first welding coating 130 of the present application may avoid a situation where in a welding process, the battery pieces are damaged due to excessive welding temperature.

In one example, the thickness of the first welding coating, 130, is in a range from 20 μm to 30 μm, for example, the thickness of the first welding coating is 20 μm, 22 μm, 24 μm, 26 μm, 28 μm or 30 μm.

In one example, the first welding coating 130 completely covers the whole surface of the inner wall of the depression 120, in other examples, the first welding coating 130 does not completely cover the whole surface of the inner wall of the depression 120, and the surface of the inner wall at a region of the depression 120 away from an opening is not coated with the first welding coating 130. When an area of the first welding coating is relatively large, the thickness of the first welding coating 130 may be adaptively reduced.

When the area of the first welding coating is relatively small, the thickness of the first welding coating 130 may be adaptively increased.

In one example, at least part of the region of other surfaces, except for the depression 120, of the first welding ribbon body 110 is also coated with the first welding coating 130, and the first welding coating 130 of these regions is only used as a surface reflective layer, with a thickness ranging from 5 μm to 10 μm. For example, the thickness is 5 μm, 6 μm, 7 μm, 8 μm, 9 μm or 10 μm. During welding treatment, after the first welding coating 130 on these surfaces is molten, it will be gathered in the depression 120 or a position where the depression 120 is in contact with the battery pieces, which increases the welding tension between the welding ribbon component and the battery pieces.

In one example, the second welding ribbon segment 200 includes: a second welding ribbon body 210, a welding surface of the second welding ribbon body 210 at least being a plane, and the welding surface and the depression 120 being located on the upper and lower side surfaces of the welding ribbon component in a height direction respectively; and a second welding coating 220 located at least on the welding surface of the second welding ribbon body 210.

In the above example, the welding surface of the second welding ribbon body 210 is the plane, on the one hand, the contact area between the welding ribbon component and the battery pieces can be increased, and the problems of poor adsorption force and prone desoldering between the welding ribbon component and the battery pieces are solved; and on the other hand, even if a thin second welding coating 220 is formed on the welding surface, it can still ensure the adsorption force between the welding ribbon component and the battery pieces, which may save materials of the second welding coating 220, and reduce the costs.

In one example, surfaces, except for the welding surface, of the second welding ribbon body 210 are also coated with the second welding coating 220.

In one example, a shape of a cross-section of the second welding ribbon body 210 in the length direction perpendicular to the second welding ribbon body 210 includes a rectangle or a trapezoid. In one example, a lower surface of the second welding ribbon body 210 in a height direction is an arc surface. The shape of the second welding ribbon body 210 may be set according to specific application scenarios, and the universality is high.

Figure 8:
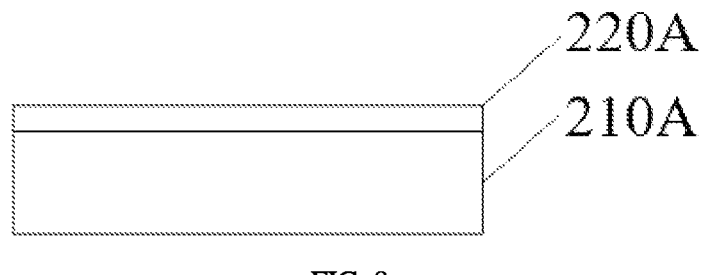

Referring to FIG. 8, in one example, the second welding ribbon segment 200 includes a second welding ribbon body 210A and a second welding coating 220A located at least on a welding surface of the second welding ribbon body 210A. A cross-section of the second welding ribbon body 210A in a length direction perpendicular to the second welding ribbon body 210A is in a rectangle shape.

Figure 9:
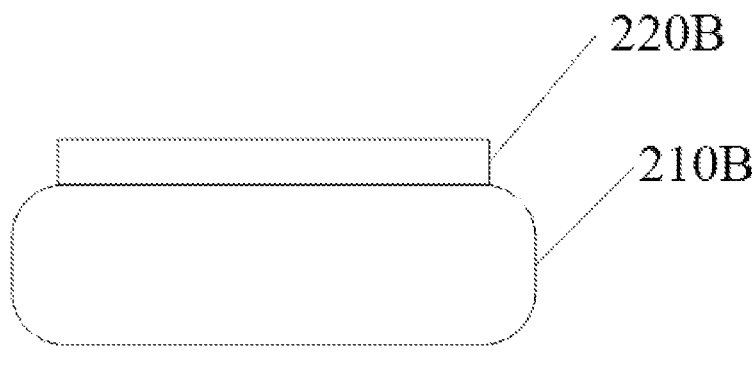

Referring to FIG. 9, in one example, the second welding ribbon segment 200 includes a second welding ribbon body 210B and a second welding coating 220B located at least on a welding surface of the second welding ribbon body 210B. A cross-section of the second welding ribbon body 210B in a length direction perpendicular to the second welding ribbon body 210B is in a rounded rectangle shape.

Figure 10:
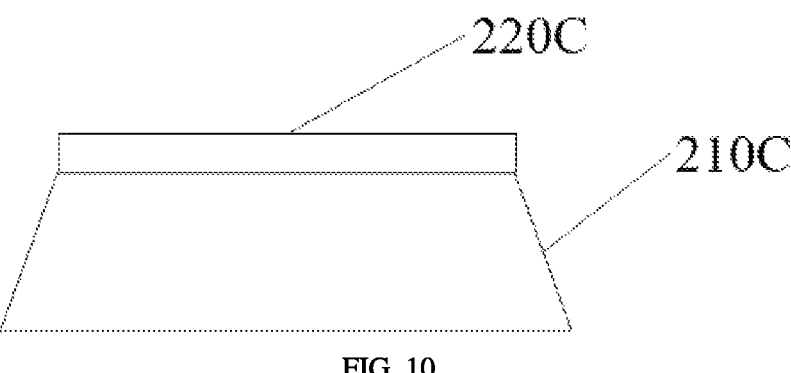

Referring to FIG. 10, in one example, the second welding ribbon segment 200 includes a second welding ribbon body 210C and a second welding coating 220C located at least on a welding surface of the second welding ribbon body 210C. A cross-section of the second welding ribbon body 210C in a length direction perpendicular to the second welding ribbon body 210C is in a trapezoid shape.

Figures 11, 12, 13:
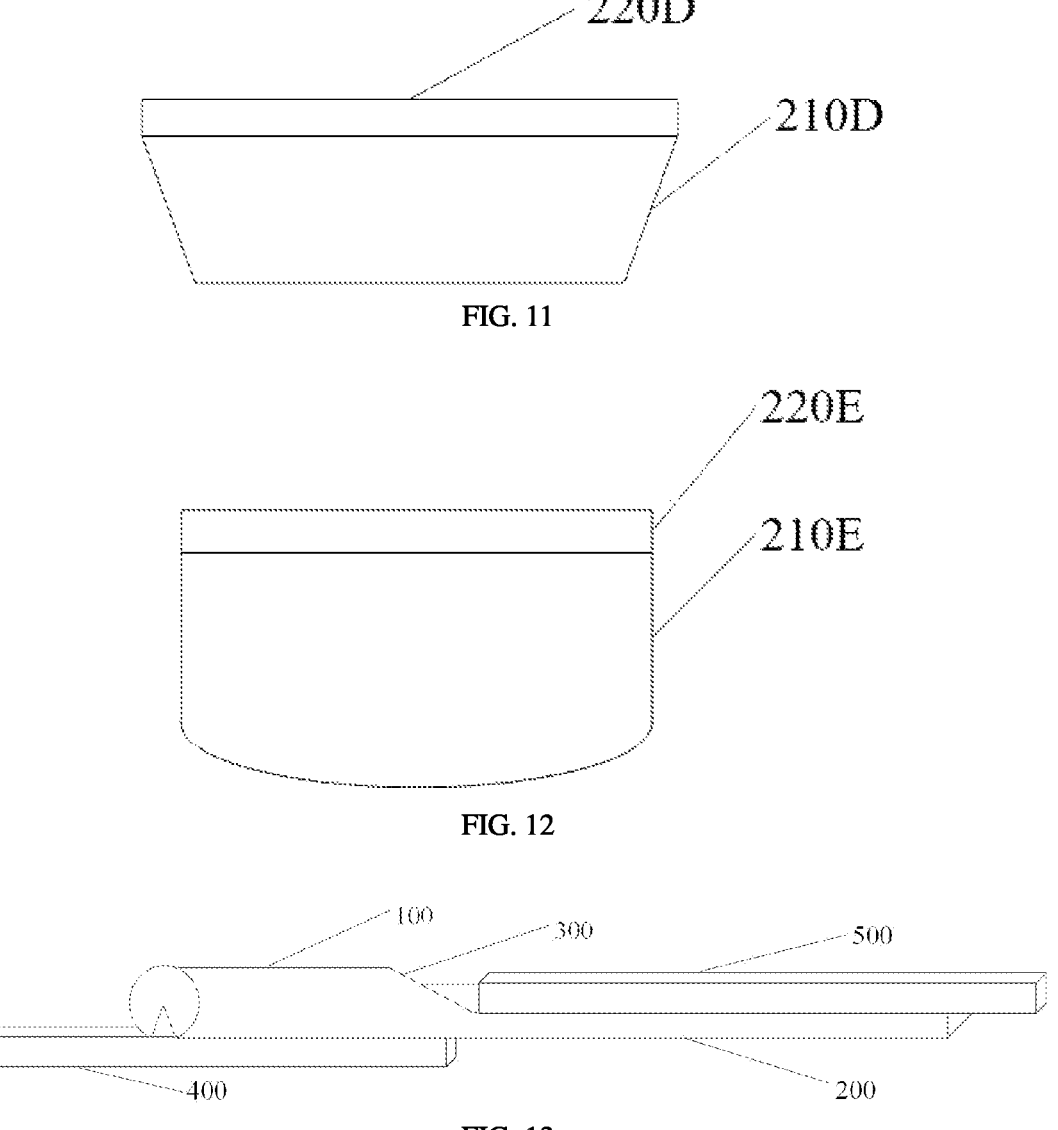
FIG. 13 is a schematic structural diagram of a part of a photovoltaic module of an example of the present application.

Referring to FIG. 11, in one example, the second welding ribbon segment 200 includes a second welding ribbon body 210D and a second welding coating 220D located at least on a welding surface of the second welding ribbon body 210D. A cross-section of the second welding ribbon body 210D in a length direction perpendicular to the second welding ribbon body 210D is in an inverted trapezoid shape.

Referring to FIG. 12, in one example, the second welding ribbon segment 200 includes a second welding ribbon body 210E and a second welding coating 220E located at least on a welding surface of the second welding ribbon body 210E. A lower surface of the second welding ribbon body 210E in a height direction is an arc surface.

Figure 7:
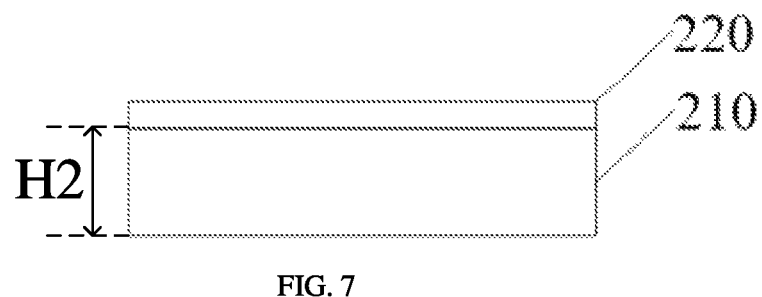
FIG. 7 to FIG. 12 are cross-sectional views of a second welding ribbon segment of an example of the present application.

Referring to FIG. 7, in one example, a size H2 of the second welding ribbon body 210 in the height direction of the second welding ribbon body 210 is in a range from 130 μm to 200 μm. For example, the size H2 of the second welding ribbon body 210 in the height direction of the second welding ribbon body 210 is 130 μm, 140 μm, 160 μm, 180 μm or 200 μm. The size H2 of the second welding ribbon body 210 in the height direction is smaller than a maximum size of the first welding ribbon body 110 in a height direction.

In one example, one end of a connecting segment 300 is connected with one end of the first welding ribbon segment 100, and the other end of the connecting segment 300 is connected with one end of the second welding ribbon segment 200.

In one example, a thickness of the connecting segment 300 gradually decreases in a direction from the first welding ribbon segment 100 to the second welding ribbon segment 200.

Referring to FIG. 1, and in conjunction with FIG. 2, in one example, one side of the connecting segment 300 facing away from the depression 120 is an inclined plane.

In the above example, the distance between the first welding ribbon segment 100 and the second welding ribbon segment 200 which are connected through the connecting segment 300 is reduced, so that when a photovoltaic module is finally prepared, a piece spacing between the adjacent battery pieces can be reduced to below 1.0 mm, achieving the assembly of more battery pieces under the same area, achieving the purpose of high-density packaging, and increasing an effective area of the photovoltaic module.

In one example, the melting point of the second welding coating 220 is smaller than the melting point of the second welding ribbon body 210.

In one example, the second welding coating 220 includes a second tin-bismuth-lead welding coating or a second tin-bismuth-silver welding coating.

In one example, a molar proportion of tin in the second tin-bismuth-lead welding coating is greater than or equal to 40% and smaller than 50%, a molar proportion of bismuth in the second tin-bismuth-lead welding coating is greater than or equal to 40% and smaller than 50%, and a molar proportion of lead in the second tin-bismuth-lead welding coating is greater than zero and smaller than or equal to 20%. For example, the molar ratio of tin to bismuth to lead in the second tin-bismuth-lead welding coating is 4:4:2 or 43:43:14.

In one example, a molar proportion of tin in the second tin-bismuth-silver welding coating is greater than or equal to 40% and smaller than 50%; a molar proportion of bismuth in the second tin-bismuth-silver welding coating is greater than or equal to 40% and smaller than 50%, and a molar proportion of silver in the second tin-bismuth-silver welding coating is greater than zero and smaller than or equal to 20%.

For example, the molar ratio of tin to bismuth to silver in the second tin-bismuth-silver welding coating is 4:4:2 or 43:43:14.

In the above example, the second tin-bismuth-lead welding coating or the second tin-bismuth-silver welding coating selected by the second welding coating 220 may both achieve low-temperature welding. A transparent conducting layer commonly used in the battery pieces is sensitive to high temperatures, and the use of the second welding coating 220 of the present application may avoid a situation where in a welding process, the battery pieces are damaged due to excessive welding temperature.

In one example, the second welding coating 220 has a thickness ranging from 15 μm to 22 μm. For example, the thickness of the second welding coating 220 is 15 μm, 16 μm, 18 μm, 20 μm or 22 μm.

In the above example, the thickness of the second welding coating 220 is relatively small, so overall size of the second welding ribbon segment 200 in the height direction is relatively small, the distance between the first welding ribbon segment 100 and the second welding ribbon segment 200 can be reduced, a piece spacing between the battery pieces is reduced, so as to achieve high-density packaging while reducing the use cost of the second welding coating 220, and an effective area of the photovoltaic module is increased.

EXAMPLE 2

A second aspect of the present application provides a method for preparing a welding ribbon component, including a first welding ribbon segment formed, a second welding ribbon segment, and a connecting segment formed, the connecting segment is located between the first welding ribbon segment and the second welding ribbon segment; wherein a method for forming the first welding ribbon segment includes: a first welding ribbon body is formed on the first welding ribbon segment, and a depression is formed on a surface of the first welding ribbon body, and a first welding coating is formed at least on a surface of an inner wall of the depression.

In one example, a method for forming the first welding coating at least on the surface of the inner wall of the depression includes: a first initial welding film is formed on the surface of the inner wall of the depression; an amendment treatment is performed on the first initial welding film to make a thickness of the first initial welding film uniform; and the first initial welding film is cured after the amendment treatment is performed, so as to form the first welding coating.

Specifically, an initial welding ribbon body is provided; first calendaring processing is performed on a partial region of the initial welding ribbon body to form a first welding ribbon body with a surface having depression, and then the surface of the first welding ribbon body having the depression is immersed in a first welding coating solution. In one example, the first welding coating solution only covers a part of the depth of the depression, in other examples, the first welding coating solution covers the entire depth of the depression, or even the entire first welding ribbon body, then, the first welding ribbon body is taken out from the first welding coating solution, the excess first welding coating solution is scraped from the depression to form a first initial welding film, and finally, the first initial welding film is cured to form the first welding coating.

In one example, one end of the connecting segment relates to one end of the first welding ribbon segment, and the other end of the connecting segment is connected with one end of the second welding ribbon segment.

In one example, the second welding ribbon segment and the connecting segment are formed before forming the first welding coating. In other examples, the second welding ribbon segment and the connecting segment are formed after forming the first welding coating.

In one example, the process of forming the second welding ribbon body and the connecting segment includes a calendaring process.

In one example, a method for forming the second welding ribbon segment includes: a second welding ribbon body is formed on the second welding ribbon segment, a welding surface of the second welding ribbon body at least being a plane, and the welding surface and the depression being located on upper and lower side surfaces of the welding ribbon component in a height direction respectively; and a second welding coating is formed at least on the welding surface of the second welding ribbon body.

Specifically, second calendaring processing is performed on a part of the initial welding ribbon segment away from the first welding ribbon body to form the second welding ribbon body with the welding surface at least being the plane, and the connecting segment is formed between the first welding ribbon body and the second welding ribbon body during second calendaring processing.

In one example, a method for forming the second welding coating at least on the welding surface of the second welding ribbon body includes: a second initial welding film is formed at least on the welding surface of the second welding ribbon body, and the second initial welding film is cured to form the second welding coating.

Specifically, the second calendaring processing is performed on the residual length, except for the first welding ribbon segment of the welding ribbon component to form the second welding ribbon body with the welding surface being a plane, and the connecting segment is formed in a process of forming the second welding ribbon body, without additional processing. The welding surface of the second welding ribbon body is coated with a second welding film, and the second welding film is cured to form the second welding coating.

In one example, the welding surface and at least part of the region of other surfaces, except for the welding surface, of the second welding ribbon body are coated with the second initial welding film, and the second initial welding film is cured to form the second welding coating.

In other examples, the second welding ribbon body is immersed in a second welding coating solution and is cured after being taken out, to form the second welding coating.

EXAMPLE 3

A third aspect of the present application provides a photovoltaic module, including a plurality of battery pieces; and the above welding ribbon component, the welding ribbon component being connected with the adjacent battery pieces in series; wherein for any two adjacent battery pieces, a first welding ribbon body is welded to one side of a light receiving surface of one of the battery pieces through a first welding coating.

As shown in FIG. 13, in one example, the first welding ribbon segment 100 of the welding ribbon component is in contact with a light receiving surface of the first battery piece 400, and a second welding ribbon segment 200 of the welding ribbon component is in contact with a backlight surface of a second battery piece 500.

The photovoltaic module of the present application includes the above welding ribbon component, The size of a second welding ribbon body in a height direction is smaller than the maximum size of the first welding ribbon body in a height direction since the size of the second welding ribbon segment in the height direction is relatively small, a distance between the first welding ribbon segment and the second welding ribbon segment can be reduced, so that a piece spacing between the battery pieces is reduced, and an effective area of the photovoltaic module is increased.

In one example, the welding ribbon component further includes: a second welding ribbon segment and a second welding coating at least located on the welding surface of the second welding ribbon body, wherein the second welding ribbon segment includes a second welding ribbon body, at least a welding surface of the second welding ribbon body is a plane, and the welding surface and the depression are located on upper and lower side surfaces of the welding ribbon component in a height direction respectively; wherein a melting point of the second welding coating is smaller than a melting point of the second welding ribbon body; wherein for any two adjacent battery pieces, the second welding ribbon body is welded to one side of a backlight surface of the other of the battery pieces through the second welding coating.

In one example, the battery pieces are heterojunction cells. The welding ribbon components are in direct contact with main grid lines on surfaces of the heterojunction cells for conductive interconnection, and then packaging materials of the photovoltaic module are used for stacked laying and lamination in sequence to obtain a heterojunction solar cell assembly, aiming at solving the technical problems of low welding tension between traditional heterojunction cells and the welding ribbon components, strict process control requirements and low one-time success rate in the prior art.

In one example, the method for preparing the above photovoltaic module includes the following steps.

1) Preparation of battery strings.

The welding ribbon components are installed on a welding strip reel shaft of a string welding machine and are laid on battery pieces of a conveyor belt after being pulled and stretched by a traction clamp. The battery pieces are in half pieces, sequentially stacked and arranged in strings with the laying rhythm of the welding ribbon components, and the arranged battery strings are instantly heated and cooled through a welded lightbox and are welded into strings. After there is no abnormality in a cutting test through a string cutter, they flow out of the string welding machine. Preparation of the battery strings is completed.

2) Preparation of lower glass and a lower glue film.

2.1) A glue film with a fixed width and length is cut through a glue film cutting machine and is dragged and laid on the lower glass.

2.2) The lower glass carrying the lower glue film is transported to the position of a typesetting machine through an assembly line for typesetting.

3) Preparation of a square arrangement of battery strings.

3.1) The half battery pieces which are cut by laser are sequentially arranged and welded through the string welding machine and then are connected in series into a whole cell string.

3.2) The battery strings which are connected in series are sequentially arranged on the lower glue film in 1) according to an electrode sequence through the typesetting machine, the laying of the plurality of battery strings is completed, then the battery strings are connected by a bus bar through a stacking and welding machine, and a leading wire is reserved to be installed with a junction box in a subsequent process, and is welded to form the square array of the battery strings, and a positioning tape is pasted on a specific position of the square array through a tape dispenser to position the square array.

4) Preparation of a waterproof layer of a heterojunction solar assembly.

4.1) A waterproof glue with a certain thickness and width is laid in a region inwards along an edge of the glass at a certain distance on a lower glass surface, a certain distance is maintained between the waterproof glue and the lower glue film, and the waterproof glue is uniformly laid along a periphery of the glass surface until the whole periphery is laid fully.

5) Preparation of an upper glue film and upper glass (double glass) or a protective layer (single glass).

5.1) The glue film with the fixed width and length is cut through the glue film cutting machine and is dragged and laid on the square array of battery strings, which is aligned with the lower glue film, and meanwhile a certain spacing is maintained between the glue film and the surrounding waterproof glue.

5.2) The upper glass or the upper protective layer is laid on the upper glue film through a glass bonding machine or a laying machine to prepare stacking members of a battery assembly.

6) Cutting test of a string cutter, and appearance detection.

The appearance detection is performed on the stacking members of the battery assembly to determine whether there is a defect, the stacking members which are qualified flow into a laminating machine for lamination packaging, and the stacking members which are unqualified flow into a repair bench for repair.

7) Lamination.

The lower glass is molten through the upper and lower glue films in a lamination process, which is integrated with the upper glass or the upper protective layer to form an inseparable assembly lamination member.

8) After lamination is completed, the preparation of the heterojunction solar assembly is completed by sequentially performing the processes such as appearance detection, trimming, framing, junction box installation, gluing, curing, power testing and final detection.

Further, the upper and lower glue films in the present application are finely cut before laying, with a cutting accuracy of ±0.5 mm, and after cutting, they are transferred and laid by a manipulator.

Further, the glue film in the present application may be any one of an ethylene-vinyl acetate copolymer (EVA), polyvinyl butyral (PVB), EPE, POE polyurethane, PUR, TPO, TPU, PA and other glue films.

Further, the front and back protective layers in the present application are photovoltaic glass or a photovoltaic back plate (any one of PP, PC, PET, PE, PMMA, PS, TPT, TPE, KPK, PVF, PVDF or other materials) for packaging of general assemblies in the photovoltaic industry.

Further, the waterproof glue in the present application may be transparent waterproof glue or non-transparent waterproof glue, the composition may be any one of an isobutene polymer and an isoprene polymer, and high-performance water vapor resistance and anti-aging ability are achieved.

Further, the waterproof glue in the present application has a thickness ranging from 0.5 mm to 3.5 mm, and a width ranging from 2 mm to 15 mm.

Further, the battery pieces in the present application are double-sided heterojunction solar battery pieces, of which surfaces are provided with a transparent conducting film, and the transparent conducting film is an ITO film or an AZO film.

Obviously, the above examples are only for the purpose of clearly explaining the examples, not limiting the embodiments. For those ordinarily skilled in the art, other changes or variations in different forms may further be made on the basis of the above description. It is unnecessary and impossible to enumerate all the embodiments here. However, the obvious changes or variations arising therefrom are still within the scope of protection of the present disclosure.

The invention claimed is:

1. A welding ribbon component, comprising a first welding ribbon segment, a second welding ribbon segment and a connecting segment, wherein the connecting segment is located between the first welding ribbon segment and the second welding ribbon segment; and the first welding ribbon segment comprises a first welding ribbon body, a surface of the first welding ribbon body being provided with a depression; and a first welding coating located at least on a surface of an inner wall of the depression;

wherein the second welding ribbon segment comprises:
a second welding ribbon body;
a welding surface of the second welding ribbon body at least being a plane, the welding surface and the depression being located on upper and lower side surfaces of the welding ribbon component in a height direction respectively; and
a second welding coating at least located on the welding surface of the second welding ribbon body;
wherein one end of the connecting segment is connected with one end of the first welding ribbon segment, and the other end of the connecting segment is connected with one end of the second welding ribbon segment;
wherein a thickness of the connecting segment gradually decreases in a direction from the first welding ribbon segment to the second welding ribbon segment; and
wherein the first welding ribbon body is welded to one side of a light receiving surface of a first battery piece through a first welding coating and the second welding ribbon body is welded to one side of a backlight surface of a second battery piece through the second welding coating.

2. The welding ribbon component of claim 1, wherein the first welding ribbon body has a first cross section perpendicular to the length direction of the first welding ribbon body, an outer edge line of the first cross section comprises a first line region and a second line region connected with the first line region, the first line region is located on the surface of the inner wall of the depression, and the second line region is located on an outer surface of the first welding ribbon body at two ends of the depression;

wherein a shape of the first line region comprises a circular arc, a "V"-shape or a trapezoid; and wherein a shape of the second line region comprises a circular arc, a triangle, a trapezoid or a rectangle.

3. The welding ribbon component of claim 1, wherein a shape of a cross section of the second welding ribbon body perpendicular to the length direction of the second welding ribbon body comprises a rectangular or trapezoidal shape or a partially arced surface.

4. The welding ribbon component of claim 1, wherein one side of the connecting segment facing away from the depression is an inclined plane.

5. The welding ribbon component of claim 1, wherein a melting point of the first welding coating is smaller than a melting point of the first welding ribbon body, the melting point of the second welding coating is smaller than the melting point of the second welding ribbon body.

6. The welding ribbon component of claim 1, wherein the first welding coating has a thickness ranging from 20 μm to 30 μm, and the second welding coating has a thickness ranging from 15 μm to 22 μm.

7. The welding ribbon component of claim 2, wherein a depth of the depression is smaller than or equal to a half of a maximum distance between any two points in the second line region;

a maximum distance between any two points in the second line region is in a range from 250 μm to 350 μm.

8. The welding ribbon component of claim 1, wherein the size of the second welding ribbon body in the height direction is smaller than the maximum size of the first welding ribbon body in a height direction.

9. The welding ribbon component of claim 1, wherein the size of the second welding ribbon body in the height direction is in a range from 130 μm to 200 μm.

10. The welding ribbon component of claim 1, wherein the first welding coating comprises a first tin-bismuth-lead welding coating or a first tin-bismuth-silver welding coating; the second welding coating comprises a second tin-bismuth-lead welding coating or a second tin-bismuth-silver welding coating.

\* \* \* \* \*